United States Patent [19]

Tomita et al.

[11] Patent Number: 5,191,405
[45] Date of Patent: Mar. 2, 1993

[54] THREE-DIMENSIONAL STACKED LSI

[75] Inventors: Yasuhiro Tomita, Neyagawa; Yoshiyuki Takagi, Osaka; Shigenobu Akiyama, Hirakata; Kenichi Yamazaki, Osaka, all of Japan

[73] Assignee: Matsushita Electric Industrial Co., Ltd., Osaka, Japan

[21] Appl. No.: 452,337

[22] Filed: Dec. 19, 1989

[30] Foreign Application Priority Data

Dec. 23, 1988 [JP] Japan ................. 63-326578

[51] Int. Cl.⁵ ............. H01L 25/06; H01L 23/52; H01L 23/54
[52] U.S. Cl. .................... 257/777; 257/763; 257/765
[58] Field of Search .............. 357/59, 75, 74, 68, 357/71, 67

[56] References Cited

U.S. PATENT DOCUMENTS

| | | | |
|---|---|---|---|
| 3,508,209 | 4/1970 | Agusta et al. | 357/48 |
| 4,021,838 | 5/1977 | Warwick | 357/75 |
| 4,074,342 | 2/1978 | Honn et al. | 357/75 |
| 4,612,083 | 9/1986 | Yasumoto et al. | 357/71 |
| 4,902,637 | 2/1990 | Kondou et al. | 357/71 |
| 4,939,568 | 7/1990 | Kato et al. | 357/75 |

FOREIGN PATENT DOCUMENTS

| | | |
|---|---|---|
| 0076101 | 4/1983 | European Pat. Off. . |
| 0238089 | 9/1987 | European Pat. Off. . |
| 0314437 | 5/1989 | European Pat. Off. . |
| 59-155951 | 9/1984 | Japan ........... 357/75 |
| 0145774 | 6/1987 | Japan ........... 357/67 |
| 63-156348 | 6/1988 | Japan ........... 357/75 |

OTHER PUBLICATIONS

Tsao et al., American Institute of Physics, "Tungsten Deposition on Porous Silicon for Formation of Buried Conductors in Single Crystal Silicon", Applied Physics Letters, vol. 49, No. 7, pp. 403-405, Aug. 18, 1986, New York, NY.

Primary Examiner—William Mintel
Assistant Examiner—S. V. Clark
Attorney, Agent, or Firm—Stevens, Davis, Miller & Mosher

[57] ABSTRACT

Disclosed is a three-dimensionally stacked LSI having a plurality of integrated-circuit layers stacked together, each of which is equipped with a plurality of circuit elements. Each of the circuit elements are equipped a power terminal of its own, which is connected through interlayer via-hole wiring to the power wiring of the uppermost integrated-circuit layer. The power wiring of the uppermost integrated-circuit layer is formed of a metal exhibiting a low electrical resistance, for example, Al, whereas the metal wirings of the other layers, which are exposed to high temperatures when forming the upper layers, are formed of W.

4 Claims, 5 Drawing Sheets

THREE-DIMENSIONAL STACKED LSI

BACKGROUND OF THE INVENTION

This invention relates to the structure of a three-dimensional stacked LSI.

In a three-dimensional stacked LSI, silicon single-crystal layers wherein, devices such as transistors are formed of three-dimensionally stacked together with interlayer insulators therebetween, whereas, in conventional integrated circuits, devices are integrated in a plane. Because of its structure, a three-dimensional stacked LSI provides the following advantages in addition to improved integration density: first, the wiring length is far shorter than wiring length among plural planes since three-dimensional interlayer wiring is possible. As a result, signal propagation delay time is shortened and power dissipation is reduced. Second, it is suited for ultra-parallel processing since it allows a number of signals in the same plane to be simultaneously transferred between layers.

In preparing a three-dimensional stacked LSI, it is necessary to stack on already formed devices a silicon single-crystal layer through the intermediary of an interlayer insulator such as silicon dioxide and work it into the devices. Laser annealing and electron beam annealing have been developed as techniques for growing layer crystals. In both methods, silicon single crystals are obtained by locally melting poly-crystalline or amorphous silicon by means of a laser or an electron beam and recrystallizing the same. Thus, in the processes of forming the silicon single-crystal layer on top, forming the gate insulating film, activating the impurity doping, and so on, the wiring and devices are exposed to high temperatures. The low-melting-point metal (e.g. aluminium) wiring adopted in ordinary integrated circuits will easily react or melt at these process temperatures, thereby causing problems such as disconnection. In view of this, a heat-resistant wiring material which does not melt or easily react at these process temperatures must be employed in a three-dimensional stacked LSI. Tungsten, titanium, and molybdenum, or a silicide thereof, are known to be suitable as this heat-resistant wiring material. However, these metals exhibit an electrical resistance an order of magnitude higher than aluminum, which is used in ordinary integrated circuits. For instance, the electrical resistance of a 0.8 μm thick aluminum sheet is 0.05 $\Omega/\square$, whereas that of a 0.3 m thick tungsten sheet is about 0.5 $\Omega/\square$. The electrical resistance might be lowered by augmenting the film thickness. However, an excessive film thickness is undesirable from the viewpoint of stress and planarization.

Now, using a material with a high electrical resistance for wiring involves various problems including circuit malfunction due to voltage drop and operation speed reduction. In particular, a voltage drop in the power wiring constitutes a problem in the case of a three-dimensional stacked LSI performing a highly parallel circuit operation. For, in a parallel circuit, the number of devices which simultaneously operate increases in proportion to the degree of parallelism of the circuit, resulting in an increase in the dissipation current of the entire circuit, and in the case of a CMOS the circuit, an increase in the peak value of the dissipation current. In a three-dimensional stacked LSI which returns highly parallel processing, a voltage drop due to the power wiring resistance results in a reduction in operation speed, a reduced operation margin, malfunction of the logic gates, etc. If, in the case of a high-resistance wiring, a mask layout is adopted in which a wide power-wiring is used and in which priority is given to this wide powerwiring over other kinds of wiring with a view to eliminating the above problem, the power wiring will inevitably surround the devices, resulting in a large layout area and a lowered degree of flexibility in the layout of the inter-device signal wiring.

SUMMARY OF THE INVENTION

This invention has been made in view of the problem mentioned above. It is accordingly an object of this invention to provide a three-dimensional stacked LSI whose wiring structure is such that the power voltage is supplied to the internal circuit elements in a stable manner and a high degree of flexibility in the wiring is secured, even if a high-resistance wiring material and a highly-parallel circuit structure are adopted.

Another object of this invention is to make it possible to avoid a reduction in operation speed due to a power voltage drop, reduction in operation margin, and malfunction of the logic gates in a three-dimensional stacked LSI.

In accordance with this invention, there is provided a three-dimensional stacked LSI comprising a plurality of integrated-circuit layers stacked together, each of which is equipped with a plurality of circuit elements, each of the above-mentioned circuit elements being individually equipped with a power terminal that are connected through via-hole wiring between stacked layers to the power wiring of the uppermost integrated-circuit layer.

Since the wiring layer of the uppermost integrated-circuit layer (the layer to be formed last) is not subjected to high-temperature processes, it may adopt a low-resistance material, such as aluminum, which is used in the usual integrated circuits. In the integrated-circuit layers constituting the lowermost and the middle layers, for whose wiring a high-resistance material such as tungsten is used, the devices in each layer are divided into groups, the number of devices in each group being such as will not involve substantial voltage drop. These groups constitute circuit elements, for each of which a power terminal is provided. These power terminals are connected through via-hole wiring between stacked layers to the power wiring of the uppermost integrated-circuit layer, thereby supplying the power for all the integrated-circuit layers from the power wiring of the uppermost integrated-circuit layer. Thus, even if many circuit elements operate simultaneously and a large dissipation current flows through the entire circuit, the entire dissipation current flows through the low resistance power wiring in the uppermost layer, thus making it possible to keep the reduction and fluctuation in the power voltage to the minimum.

DETAILED DESCRIPTION OF THE PREFERRED EMBODIMENTS

Figure 1A:
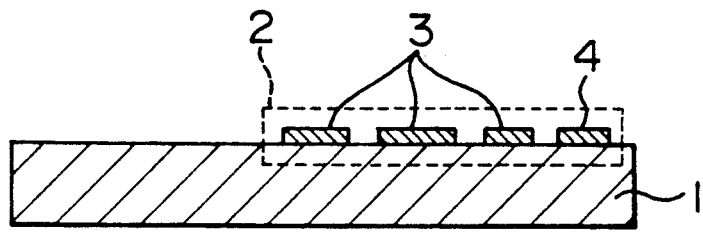
FIGS. 1(a) to 1(h) are sectional views showing the processes of manufacturing a three-dimensional stacked LSI with four layers in accordance with a first embodiment of this invention.
Figure 1B:
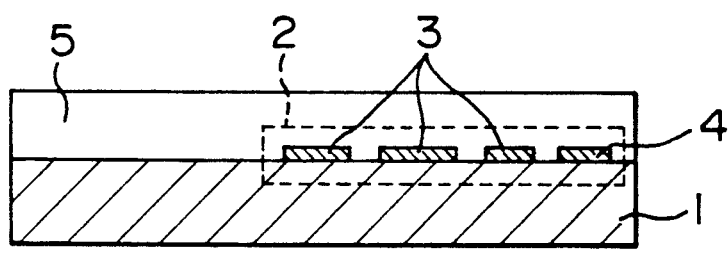
Figure 1C:
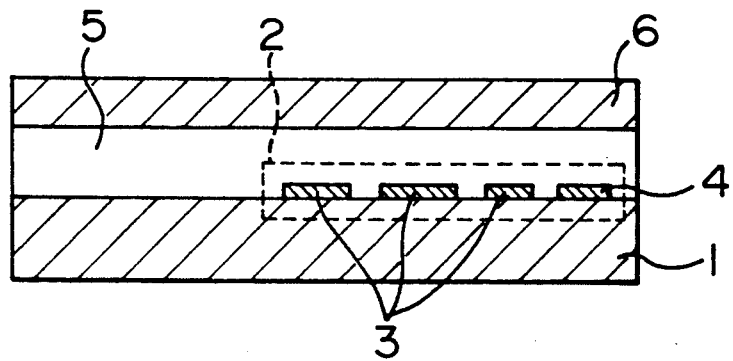

Embodiments of this invention will now be described with reference to the accompanying drawings. FIGS. 1(a) to 1(h) are sectional views showing the manufacturing processes of a three-dimensionally stacked LSI with four layers in accordance with a first embodiment of this invention. Referring to FIG. 1(a), the reference numeral 1 indicates a Si semiconductor substrate comprising the first active layer, and 2 indicates a circuit element composed of a plurality of electronic devices such as MOS transistors. The reference numeral 3 indicates inter-device wiring connecting the devices in the circuit element 2 to one another. Since the wirings 3 are exposed to a high temperature of about 900° C. when forming the upper layer, the wirings 3 are formed of a refractor metal such as tungsten, the melting point of which is 3411° C. The reference numeral 4 indicates power terminals connected to the power wirings of the circuit element 2. Likewise the inter-device wirings 3, the power terminals 4 are formed of tungsten. After the formation of the interdevice wirings 3 and the power terminals 4 of the first active layer, an interlayer insulator 5 for separating and insulating layers from each other is formed, as shown in FIG. 1(b). This interlayer insulator 5 is made of SiO₂ or the like and has a thickness of about 0.5 μm to 0.7 μm. In the step shown in FIG. 1(c), poly-crystalline silicon or amorphous silicon is formed by chemical vapor deposition, which is crystallized by a beam crystallization method such as laser crystallization or electron beam crystallization, thereby forming a second active layer 6 having a thickness of about 0.5 μm.

Figure 1D:
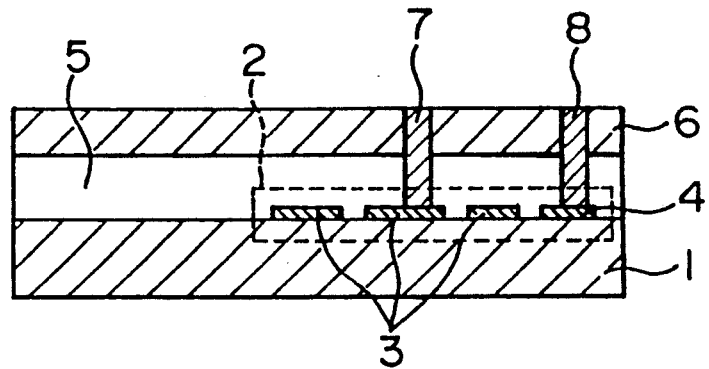
Figure 1E:
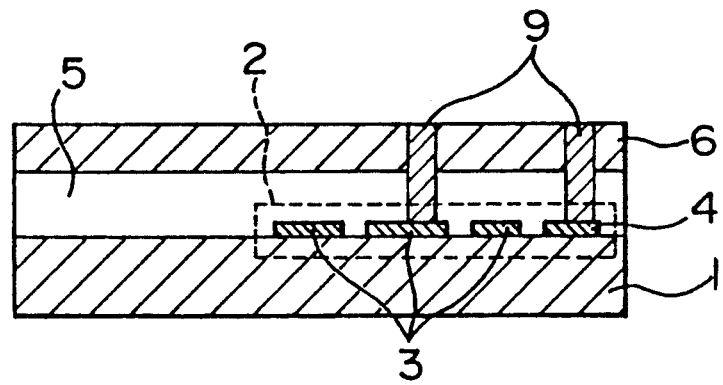

Next, in the step shown in FIG. 1(d), via holes 7 and 8 having a diameter of about 2 μm and a depth of about 3 μm are formed in the second active layer 6 and the insulator 5. These via holes 7 and 8 are utilized when forming via-hole wiring between stacked layers for interlayer connection. These via holes can be formed through a usual semiconductor etching process. That is, the via holes are formed by dry etching after positioning them by the photoetching method. The via hole 7 serves to connect the devices of the circuit elements 2 of the first layer to the devices of the circuit element of a third layer which is to be described below. The via hole 8 is used when supplying power from the uppermost layer to the circuit element 2 of the first layer. As shown in FIG. 1(e), tungsten pieces are embedded in these via holes 7 and 8, thereby forming via-hole wirings 9. The formation of the via-hole wirings 9 can be effected by selective deposition of tungsten (W) exclusively in the areas of the via holes 7 and 8.

Figure 1F:
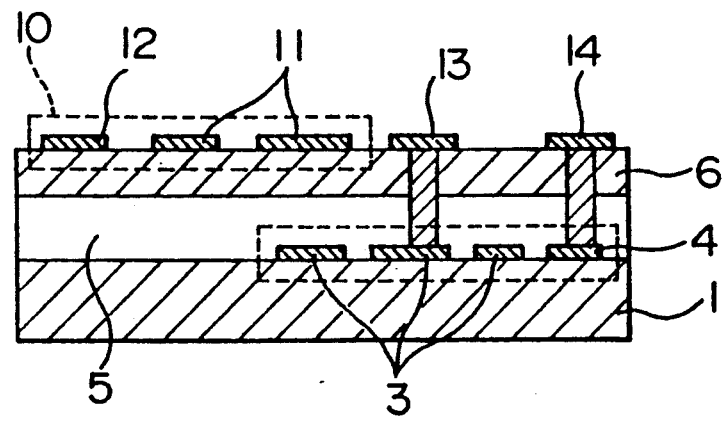

Afterwards, devices such as MOS transistors are formed in the active layer 6 along with the inter-device wiring thereof. This manufacturing stage is shown in FIG. 1(f). The reference numeral 10 indicates a circuit element consisting of a plurality of devices formed in the second active layer 6. Here, a usual MOS-transistor-forming process is conducted at a temperature of about −900° C. The reference numeral 11 indicates inter-device wirings connecting the devices in the circuit elements 10 to one another, and 12 indicates power terminals connected to the power wirings of the circuit element 10. The reference numeral 13 indicates relay terminals for connecting the devices of the circuit element 2 of the first layer to the devices of a circuit element of a third layer. The reference numeral 14 indicates power relay terminals used when supplying power from the power wirings of the uppermost layer to the circuit element 2 of the first layer. The inter-device wirings 11, the power terminals 12, the relay terminals 13, and the power relay terminals 14 are formed of tungsten since they are exposed to a high temperature when forming the upper layer.

Figure 1G:
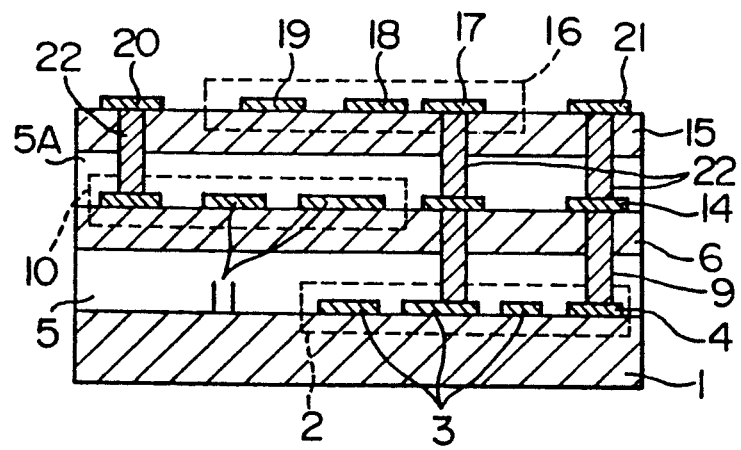

Afterwards, processes which are the same as those of FIGS. 1(b) to 1(f) are repeated, thereby forming the third layer. FIG. 1(g) shows the state in which the third layer has been formed. The reference numeral 15 indicates the third active layer formed by beam crystallization and consisting of single-crystal silicon or the like. The third active layer 15 can be formed by the same method used when forming the layer 6.

The third active layer 15 includes a circuit element 16, a connecting terminal 17 connecting the devices of the circuit element 2 of the first layer to the devices of the circuit element 16 of the third layer, a power terminal 18, inter-device wiring 19 for the circuit element 16, a power relay terminal 20 for supplying power to the circuit element 10 of the second layer, a power relay terminal 21 for supplying power to the circuit element 2 of the first layer, and via-hole wiring 22 connecting the second and third layers to each other and formed, as the via-hole wiring 9, through selective deposition of W in via holes. The connecting terminal 17, the inter-device wiring 19, the power terminal 18, and the power relay terminals 20 and 21 are formed of tungsten since they are exposed to a high temperature when forming the upper layer.

Figure 1H:
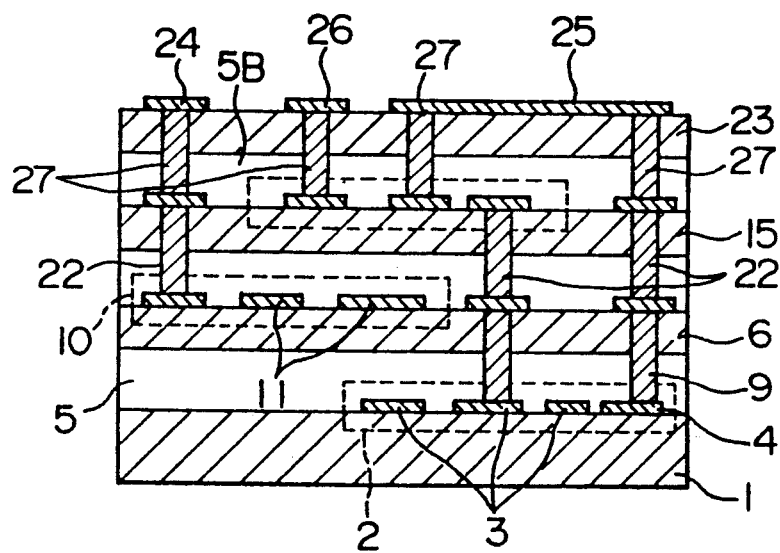

By repeating processes which are the same as those of FIGS. 1(b) to 1(f), a fourth layer can be formed. FIG. 1(h) shows the state in which the fourth layer has been formed. The reference numerals 5A and 5B indicate interlayer insulators made of a material such as SiO₂ or the like, and 23 indicates the fourth active layer consisting of single-crystal silicon or the like. The reference numerals 24 and 25 indicate power wirings formed of aluminum, and 26 indicates an inter-device wirings for the fourth layer likewise formed of aluminum. The power wirings 24, 25 and the inter-device wirings 26 are connected to the third layer through via-hole wiring 27 formed by selective deposition of W.

As stated above, aluminum sheet resistivity is far smaller than tungsten sheet resistivity, so that, even when the power terminals and wiring of the lower layers are collectively connected thereto, there is very little fear of power voltage drop, etc., thus constituting no obstacle to the circuit operation. Since the aluminum wirings 24, 25 and 26 are provided on the uppermost layer and no further high-temperature process is conducted after their formation, there is no danger of disconnection or the like taking place, thus making it possible to realize a pattern formation with a high degree of flexibility in arrangement.

Figure 4:
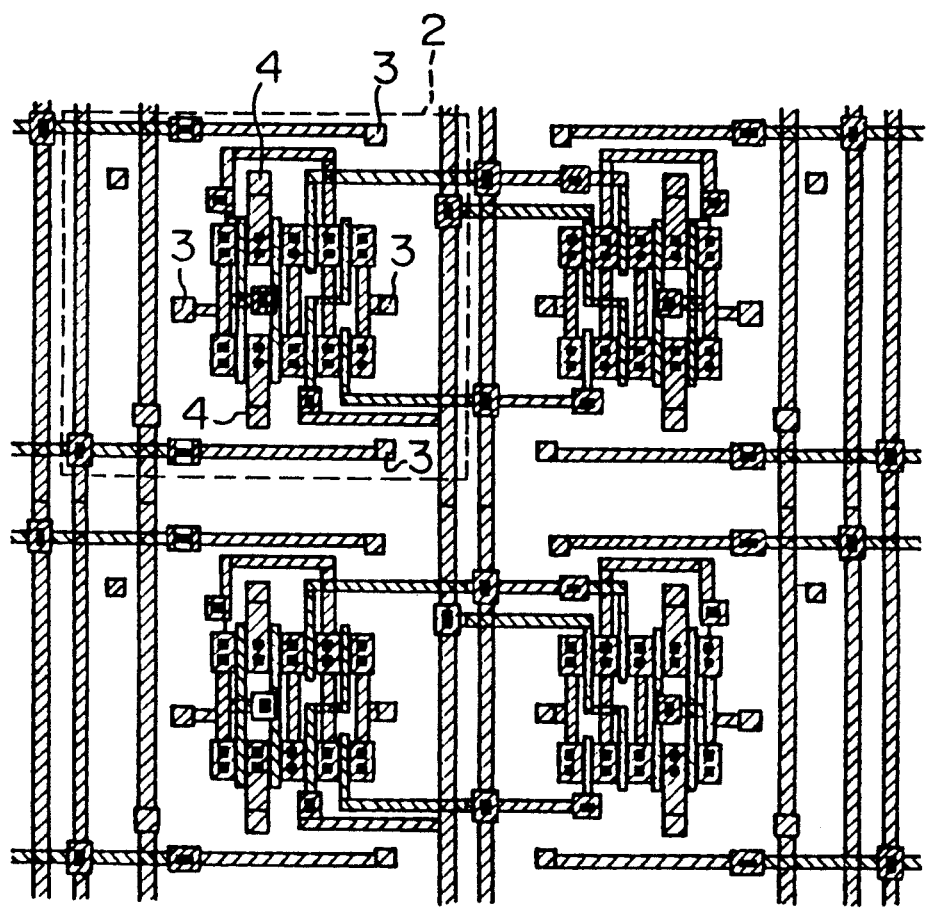
FIG. 4 is a pattern layout diagram showing an example of circuit elements in a three-dimensional stacked LSI.

FIG. 4 shows an example of the circuit element 2, etc. Formed on the semiconductor substrate or layer are a lot of wiring of poly-silicon, tungsten or the like and eight MOS transistors, thus forming an appropriate circuit block or an circuit area or a circuit zone. Thus, this circuit element has the same structure as, for example, a part of an ordinary MOS LSI. However, it should be added that a refractory material such as tungsten is used for the wiring of the elements formed in the lower and middle layers.

The number of devices in a circuit element, which determine the intensity of the dissipation current, is determined such that the voltage drop due to the electrical resistance of the inter-device power wiring in the circuit element and of the power terminal and to the resistance of the via-hole wiring for power supply will not affect the circuit operation.

This will be described in detail below. Suppose the minimum voltage for guaranteeing the operation of the circuit element is VMIN; the power voltage of the power wiring in the uppermost layer is VDD; the sum total of the power wiring resistance between the devices in the circuit element (which has a tendency to increase as the area of one circuit element increases), the electrical resistance of the power terminal, and the resistance of the power via-hole wiring between stacked layers is R; and the dissipation current flowing through the power via-hole wiring between stacked layers (which has a tendency to increase as the number of devices in the circuit element increases, its magnitude depending on the power voltage) is I; the scale of the circuit element (its area and number of devices) is then so determined that the following relationship is established:

$$VMIN < VDD - R * I (VDD)$$

Accordingly, even in the case where a large number of circuit elements are provided in each layer and where they operate simultaneously, the dissipation current of a large ampere order of the entire circuit element flows through the low-resistance aluminum power wiring on the uppermost layer, thus effectively preventing a power voltage drop.

Further, since in this power wiring structure power is supplied through stacked different layers, the degree of flexibility in wiring arrangement is heightened, which helps to diminish the layout area.

This will be explained with reference to FIGS. 3(a) and 3(b), which show the layout of four transistors in a circuit element of a middle layer. In the layout shown in FIG. 3(a), adopting the structure of this invention, via-hole wiring between stacked layers is 10 provided, whereas the layout shown in FIG. 3(b), not adopting this invention, has no via-hole wiring between stacked layers.

Figure 3A:
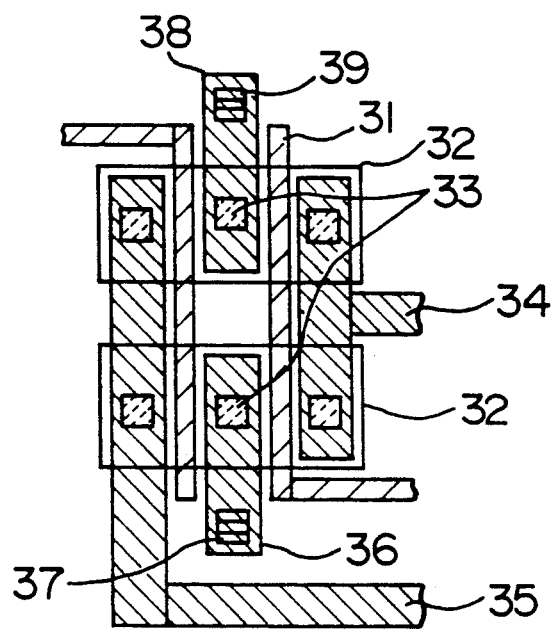
FIGS. 3(a) and 3(b) are mask layout diagrams showing the improvement in the flexibility in wiring attained in the circuit elements of a medium layer by via-hole wiring provided between stacked layers.

Referring to FIG. 3(a), the reference numeral 32 indicates silicon islands which are formed of 5 recrystallized silicon (e.g., the layer 6: see FIG. 1) and which are surrounded by silicon dioxide. Transistors are formed on these silicon islands 32. This circuit element is composed of four devices. The reference numeral 31 indicates poly-silicon wiring constituting the gates and wiring of the transistors. The reference numeral 35 indicates tungsten wiring, and 33 indicates contact holes connected to the drain and sources of the transistors and the tungsten wiring. The reference numerals 36 and 38 indicate tungsten power terminals which are connected through via-hole wiring 37, 39 to the power wiring of the integrated circuit in the uppermost layer.

Figure 3B:
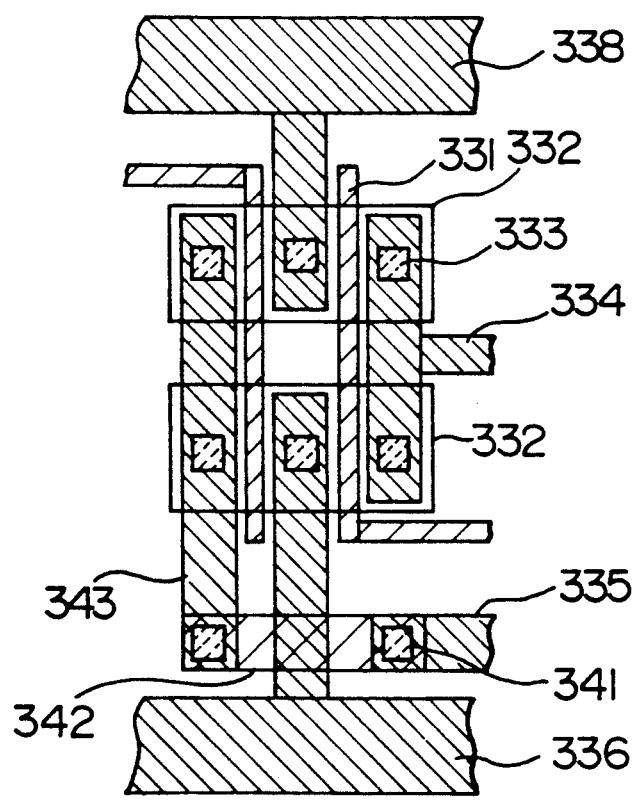

Referring to FIG. 3(b), the reference numerals 336 and 338 indicate power wiring common to the circuit elements in the same layer and surrounding the circuit elements. Tungsten wiring 335 corresponds to the tungsten wiring 35 of FIG. 3(a). Because of the presence of the power wiring 336, the tungsten wiring 335 is connected to tungsten wiring 343 by way of poly-silicon wiring 342. Thus, in this wiring structure, the power wiring 342, having a large area, is arranged externally. In addition, it is necessary to provide extra contact holes 341 and poly-silicon wiring 342. Thus, in the power wiring structure of this invention, the area allowing inter-device wiring with the power wiring only is augmented, thereby sparing extra wiring layers and contact holes.

It should be noted here that a three-dimensional stacked LSI, having integrated-circuit layers which are stacked together, with insulators, such as silicon dioxide, having a poor thermal conductivity arranged therebetween, has the problem of a poor efficiency of heat radiation for the heat generated in the middle integrated-circuit layers. In the power wiring structure of this invention, the viahole wiring between stacked layers and the power wiring on the uppermost layer connected thereto function as a sink for dissipating the heat generated in the middle layers, thereby making it possible to keep the temperature of the circuit elements from being raised. The ability to restrain temperature rise in the circuit elements is important since it enhances reliability and makes possible high-density mounting of the circuit elements.

Here it is to be added that the efficiency of heat radiation and the power-voltage-drop restraining effect are best when the area of the power wiring on the uppermost layer is augmented so that it covers the entire surface of the circuit elements.

Figure 2:
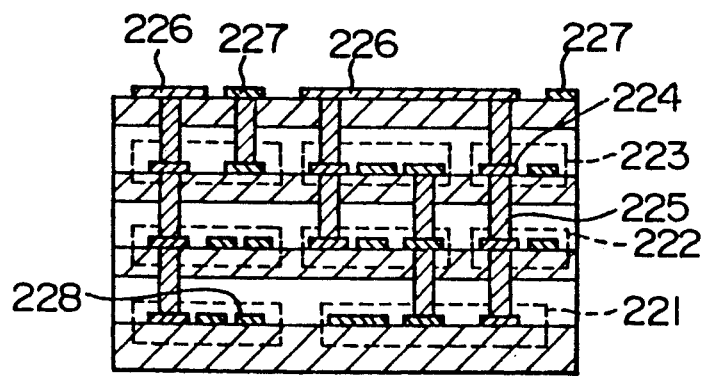
FIG. 2 is a schematic sectional view of a threedimensional stacked LSI in accordance with a second embodiment of this invention.

FIG. 2 is a schematic sectional view of a three-dimensional stacked LSI in accordance with the second embodiment of this invention. As in the first embodiment, the LSI of this embodiment has four layers. The reference numerals 221, 222 and 223 indicate circuit elements in the first, second and third layers, respectively. The reference numeral 224 indicates power terminals, which are arranged in such a manner that they are in alignment with each other as seen from above. Via-hole wiring 225 connects the power terminals 224 of the circuit elements in the first, second and third layers collectively to power wiring 226. By thus using a single via-hole wiring system to supply power to a plurality of circuit elements in different layers, the via-hole wiring between stacked layers can be used effectively, with the layout area being reduced, thus improving the integration density.

As will be apparent from the above, in a three-dimensional stacked LSI having a plurality of integrated-circuit layers stacked together, power terminals are individually provided for circuit elements in the different integrated-circuit layers and are connected through via-hole wiring between stacked layers to low-resistance power wiring on the uppermost layer, thereby making it possible to supply power voltage to the circuit elements in the different layers in a stable manner and to realize a high-speed operation which is not unlikely to involve malfunction. Further, due to the improvement in the flexibility in wiring arrangement, the layout density is heightened, making it possible to diminish the circuit device area. By arranging the circuit elements in such a manner that the positions of their respective power terminals are in alignment with each other as seen from above and connecting these power terminals collectively to the power wiring on the uppermost layer, the layout density is further heightened. In addition, the power wiring on the uppermost layer and the via-hole wiring connected thereto function as a heat sink, which helps to improve the heat dissipation characteristic of the circuit devices. This leads to enhanced reliability and an improved mounting density.

What is claimed is:

1. A three-dimensional stacked LSI comprising a plurality of integrated-circuit layers stacked together, each of said integrated-circuit layers being equipped with a plurality of circuit elements, said circuit elements being equipped with respective power terminals, which are connected through via-hole wiring between stacked layers to the power wiring of the uppermost integrated-circuit layer, wherein the wiring of the uppermost integrated-circuit layer is formed of aluminum and the wiring of the lower integrated-circuit layers and the via-hole wiring between stacked layers are formed of tungsten.

2. A three-dimensional stacked LSI as claimed in clam 1, wherein the respective power terminals of said circuit elements in said plurality of integrated-circuit layers excluding those in the uppermost layer ar arranged such that the are in alignment with one another as seen from above, the power terminals thus arranged in alignment being collectively connected through via-hole wiring between stacked layers to the power wiring of the uppermost integrated-circuit layer.

3. A three dimensional stacked LSI comprising a semiconductor substrate; a plurality of semiconductor-integrated-circuit layers formed on the semiconductor substrate with interlayer insulators being arranged therebetween; a plurality of circuit elements formed in each of said integrated-circuit layers, said circuit elements being equipped with respective power terminals; via-hole wirings provided in via-holes which are formed in those portions of said interlayer insulators and of said semiconductor integrated-circuit layers which correspond to predetermined power terminals of said circuit elements excluding those in the uppermost integrated-circuit layer; said via-hole wiring connecting said predetermined power terminals to power wiring formed on the uppermost integrated-circuit layer, wherein the power wiring of the uppermost layer is formed of aluminum, said power terminals and said via-hole wiring being formed of tungsten.

4. A three dimensional stacked LSI comprising a semiconductor substrate; a plurality of semiconductor-integrated-circuit layers formed on the semiconductor substrate with interlayer insulators being arranged therebetween; a plurality of circuit elements formed in each of said integrated-circuit layers, said circuit elements being equipped with respective power terminals; via-hole wirings provided in via-holes which are formed in those portions of said interlayer insulators and of said semiconductor integrated-circuit layers which correspond to predetermined power terminals of said circuit elements excluding those in the uppermost integrated-circuit layer; said via-hole wiring connecting said predetermined power terminals to power wiring formed on the uppermost integrated-circuit layer, wherein power relay terminals are formed on the middle integrated-circuit layers, via-hole wiring being formed in those via-holes above and below said power relay terminals.

* * * * *